US009323972B2

(12) United States Patent
Bussat et al.

(10) Patent No.: US 9,323,972 B2
(45) Date of Patent: Apr. 26, 2016

(54) FINGER BIOMETRIC SENSOR INCLUDING STACKED DIE EACH HAVING A NON-RECTANGULAR SHAPE AND RELATED METHODS

(71) Applicant: Apple Inc., Cupertino, CA (US)

(72) Inventors: Jean-Marie Bussat, San Jose, CA (US); Gordon S. Franza, Rockledge, FL (US); Giovanni Gozzini, Berkeley, CA (US)

(73) Assignee: APPLE INC., Cupertino, CA (US)

( * ) Notice: Subject to any disclaimer, the term of this patent is extended or adjusted under 35 U.S.C. 154(b) by 205 days.

(21) Appl. No.: 13/943,179

(22) Filed: Jul. 16, 2013

(65) Prior Publication Data

US 2015/0023570 A1      Jan. 22, 2015

(51) Int. Cl.
G06K 9/00 (2006.01)
H01L 25/065 (2006.01)
H01L 25/00 (2006.01)

(52) U.S. Cl.
CPC ........ *G06K 9/00013* (2013.01); *H01L 25/0657* (2013.01); *H01L 25/50* (2013.01); *H01L 2225/06541* (2013.01); *H01L 2225/06565* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 5,336,639 A * | 8/1994 | Nagaraj | H01L 23/49503 257/E23.037 |
| 5,953,441 A | 9/1999 | Setlak | |
| 5,963,679 A | 10/1999 | Setlak | |
| 6,525,547 B2 | 2/2003 | Hayes | |
| 6,611,614 B1 * | 8/2003 | Jung et al. | 382/125 |
| 7,361,919 B2 | 4/2008 | Setlak | |
| 2004/0199775 A1 * | 10/2004 | Ser et al. | 713/186 |
| 2004/0252867 A1 | 12/2004 | Lan et al. | |
| 2005/0078855 A1 * | 4/2005 | Chandler et al. | 382/116 |
| 2005/0158967 A1 * | 7/2005 | Huang | H01L 21/78 438/460 |
| 2008/0220206 A1 * | 9/2008 | Wang | H01L 21/78 428/118 |
| 2008/0220220 A1 * | 9/2008 | Wang | H01L 23/13 428/192 |
| 2009/0010502 A1 | 1/2009 | Hackbarth et al. | |
| 2010/0237990 A1 * | 9/2010 | Amano et al. | 340/5.82 |
| 2011/0084411 A1 * | 4/2011 | Eu | H01L 23/293 257/792 |
| 2011/0122059 A1 | 5/2011 | Guerrero et al. | |
| 2011/0175703 A1 | 7/2011 | Benkley, III | |
| 2012/0286429 A1 * | 11/2012 | Han | H01L 21/78 257/774 |
| 2013/0009651 A1 | 1/2013 | Benkley, III | |
| 2013/0249079 A1 * | 9/2013 | Lee | H01L 29/0657 257/737 |

(Continued)

FOREIGN PATENT DOCUMENTS

AU      2013100571 A4 *  5/2013

OTHER PUBLICATIONS

Ganesan et al., "A Low Cost CMOS Compatible MEMS based Fingerprint Sensor Design", 2012, 5 pps., Proceedings of the 2012 COMSOL Conference in Bangalore.

*Primary Examiner* — Aaron W Carter
(74) *Attorney, Agent, or Firm* — Allen, Dyer, Doppelt, Milbrath & Gilchrist, P.A.

(57) ABSTRACT

A finger biometric sensor may include first and second integrated circuit (IC) dies arranged in a stacked relation. The first IC die may include a first semiconductor substrate and an array of finger biometric sensing pixels thereon, and the second IC die may include a second semiconductor substrate and processing circuitry thereon coupled to the array of finger biometric sensing pixels. The first and second IC dies may each have respective first and second non-rectangular shapes, such as circular shapes that are coextensive.

19 Claims, 7 Drawing Sheets

(56) References Cited

U.S. PATENT DOCUMENTS

| | | | |
|---|---|---|---|
| 2013/0259329 A1* | 10/2013 | Wickboldt et al. | 382/124 |
| 2013/0265137 A1* | 10/2013 | Nelson et al. | 340/5.82 |
| 2013/0307818 A1* | 11/2013 | Pope et al. | 345/174 |
| 2013/0320915 A1* | 12/2013 | Ahlers | H01L 29/36 320/107 |
| 2015/0023570 A1* | 1/2015 | Bussat et al. | 382/124 |
| 2015/0071509 A1* | 3/2015 | Myers | 382/124 |

\* cited by examiner

FINGER BIOMETRIC SENSOR INCLUDING STACKED DIE EACH HAVING A NON-RECTANGULAR SHAPE AND RELATED METHODS

FIELD OF THE INVENTION

The present invention relates to the field of electronics, and, more particularly, to finger sensing devices and related methods.

BACKGROUND OF THE INVENTION

Fingerprint sensing and matching is a reliable and widely used technique for personal identification or verification. In particular, a common approach to fingerprint identification involves scanning a sample fingerprint or an image thereof and storing the image and/or unique characteristics of the fingerprint image. The characteristics of a sample fingerprint may be compared to information for reference fingerprints already in a database to determine proper identification of a person, such as for verification purposes.

A particularly advantageous approach to fingerprint sensing is disclosed in U.S. Pat. No. 5,953,441 to Setlak and assigned to the assignee of the present invention, the entire contents of which are herein incorporated by reference. The fingerprint sensor is an integrated circuit sensor that drives the user's finger with an electric field signal and senses the electric field with an array of electric field sensing pixels on the integrated circuit substrate.

A particularly advantageous approach to multi-biometric fingerprint sensing is disclosed in U.S. Pat. No. 7,361,919 to Setlak, which is assigned to the assignee of the present invention and is incorporated in its entirety by reference. The Setlak patent discloses a multi-finger sensing device sensing different biometric characteristics of a user's finger that have different matching selectivities.

A fingerprint sensor may be particularly advantageous for verification and/or authentication in an electronic device, and more particularly, a portable device, for example. Such a fingerprint sensor may be carried by the housing of a portable electronic device, for example, and may be sized to sense a fingerprint from a single-finger. Thus, a fingerprint sensor may be particularly advantageous for providing more convenient access to the electronic device without a password, for example, and, more particularly, without having to type the password, which is often time consuming. A fingerprint sensor may also be particularly advantageous for starting one or more applications on the electronic device.

U.S. Patent Application Publication No. 2011/0175703 to Benkley, III discloses an electronic imager using an impedance sensor grid array mounted on or about a switch. More particularly, Benkley, III discloses a switch being incorporated into a sensor assembly that allows integration of sensor operations, such as, fingerprint sensor operations. A fingerprint sensor can be used for authentication while being used together with a power switch or navigation selection switch. The authentication may be used to access the device entirely or access different levels of information.

While a fingerprint sensor used in an electronic device may be particularly advantageous for authentication, navigation, etc., it may be desirable that these sensors have a reduced size to accommodate the relatively small amount of space available on the housing of the portable electronic device. However, making a fingerprint sensor smaller may make it less accurate because a smaller sensing area is available. Thus, processing time may be increased.

SUMMARY OF THE INVENTION

In view of the foregoing background, it is therefore an object of the present invention to provide a finger biometric sensor for occupying less area in an electronic device and/or fitting a particular geometry, while maintaining accuracy and processing speed.

This and other objects, features, and advantages in accordance with the present invention are provided by a finger biometric sensor that may include first and second integrated circuit (IC) dies arranged in a stacked relation. The first IC die may include a first semiconductor substrate and an array of finger biometric sensing pixels thereon. The second IC die may include a second semiconductor substrate and processing circuitry thereon coupled to the array of finger biometric sensing pixels. The first and second IC dies may each have respective first and second non-rectangular shapes. Accordingly, the finger biometric sensor may provide a smaller package size, particularly for a non-rectangular shape, and with a reduced impact or no impact on accuracy and processing speed. For example, by moving processing circuitry typically located adjacent the finger biometric sensing pixels to another stacked die, the finger biometric sensor may be reduced in size.

The first and second non-rectangular shapes may include respective first and second closed curve shapes. For example, the first and second non-rectangular shapes may include respective first and second circular shapes.

The array of finger biometric sensing pixels may extend to adjacent a periphery of the first semiconductor substrate. The first and second non-rectangular shapes may be coextensive, for example.

The first IC die may include a plurality of electrically conductive vias extending therethrough and coupling the array of finger biometric sensing pixels and the processing circuitry. The processing circuitry may include pixel addressing circuitry and at least one gain stage coupled thereto, for example.

The finger biometric sensor may further include a top dielectric layer overlying the array of finger biometric sensing pixels. The finger biometric sensor may also include a dielectric sidewall extending downwardly from the top dielectric layer and surrounding the first and second IC dies. The array of finger biometric sensing pixels may include an array of electric field sensing pixels, for example.

An electronic device aspect is directed to an electronic device that may include a housing and the finger biometric sensor carried by the housing. The electronic device may include a wireless transceiver and a processor capable of cooperating therewith to perform at least wireless communications function. The electronic device may further include a finger-operated input device carrying the plurality of die, for example.

A method aspect is directed to a method of making a finger biometric sensor. The method may include forming a first integrated circuit (IC) die that may include a first semiconductor substrate and an array of finger biometric sensing pixels thereon. The method may further include forming a second IC die that may include a second semiconductor substrate and processing circuitry thereon to be coupled to the array of finger biometric sensing pixels. The method may also include arranging the first and second IC dies in a stacked relation. The first and second IC dies may each have respective first and second non-rectangular shapes.

DETAILED DESCRIPTION

Figure 1:
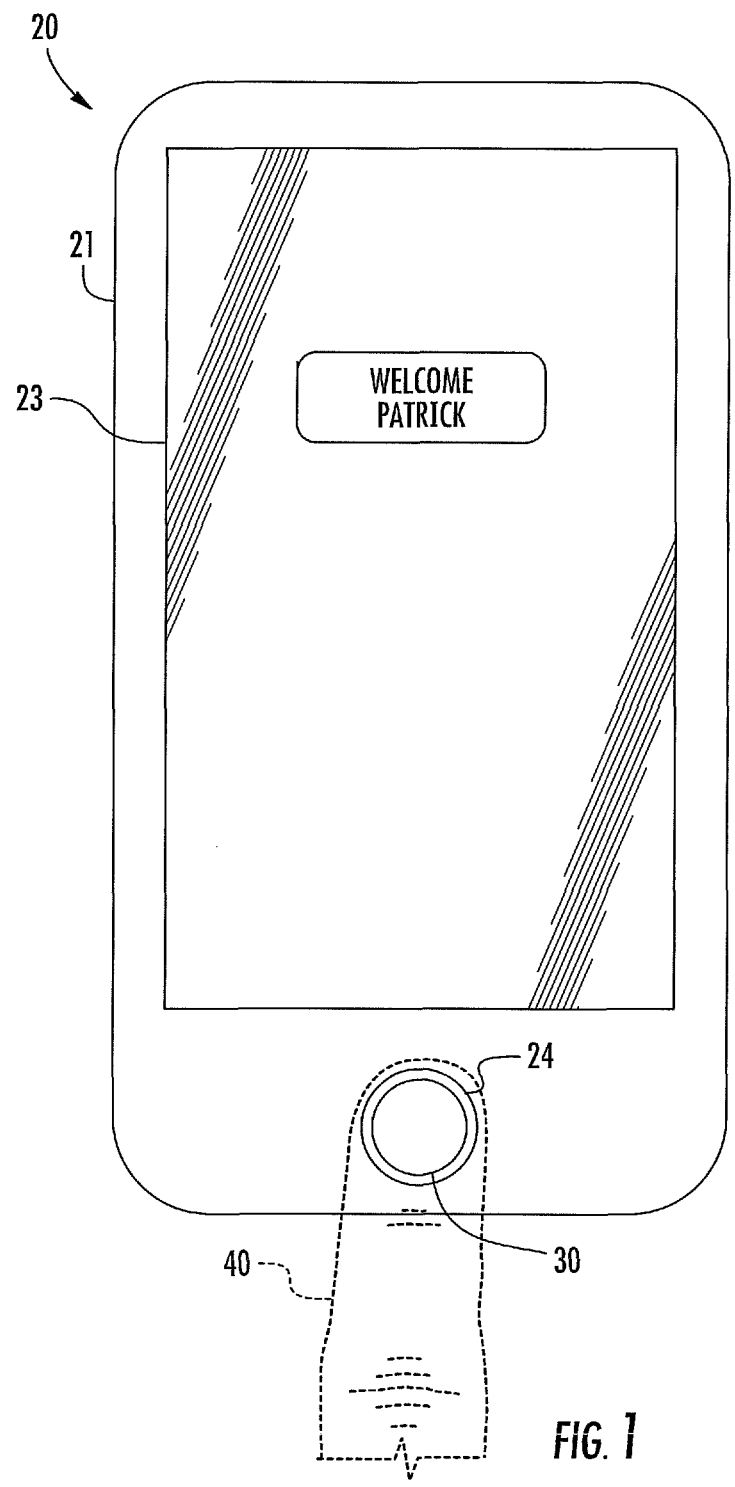
FIG. 1 is a plan view of an electronic device according to the present invention.

The present embodiments will now be described more fully hereinafter with reference to the accompanying drawings. These embodiments may, however, have in many different forms and should not be construed as limited to the embodiments set forth herein. Rather, these embodiments are provided so that this disclosure will be thorough and complete. Like numbers refer to like elements throughout, and prime and multiple prime notation, and reference numerals in increments of 100 are used to refer to similar elements in different embodiments.

Figure 2:
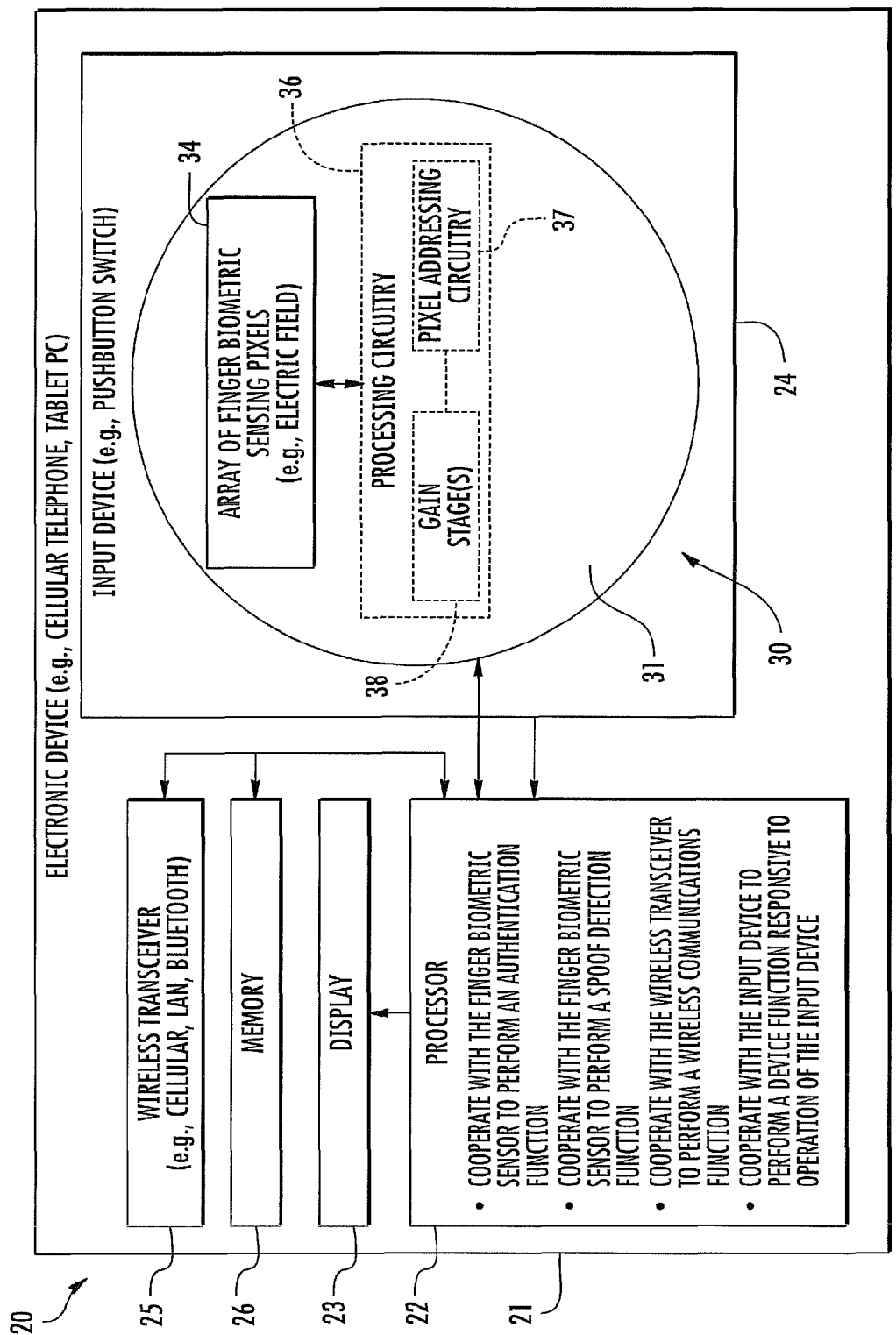
FIG. 2 is a schematic block diagram of the electronic device of FIG. 1 including a portion of a finger biometric sensor in accordance with the present invention.

Referring initially to FIGS. 1 and 2, an electronic device 20 is now described. The electronic device 20 illustratively includes a portable housing 21, and a processor 22 carried by the portable housing. The electronic device 20 is illustratively a mobile wireless communications device, for example, a cellular telephone. The electronic device 20 may be another type of electronic device, for example, a tablet computer, laptop computer, etc.

A wireless transceiver 25 (e.g. cellular, WLAN Bluetooth, etc.) is also carried within the housing 21 and coupled to the processor 22. The wireless transceiver 25 cooperates with the processor 22 to perform at least one wireless communications function, for example, for voice and/or data. In some embodiments, the electronic device 20 may not include a wireless transceiver 25.

A display 23 is also carried by the portable housing 21 and is coupled to the processor 22. The display 23 may be a liquid crystal display (LCD), for example, or may be another type of display, as will be appreciated by those skilled in the art. A memory 26 is also coupled to the processor 22.

A finger-operated user input device, illustratively in the form of a pushbutton switch 24, is also carried by the portable housing 21 and is coupled to the processor 22. The pushbutton switch 24 cooperates with the processor 22 to perform a device function in response to the pushbutton switch. For example, a device function may include a powering on or off of the electronic device 20, initiating communication via the wireless communications circuitry 25, and/or performing a menu function.

More particularly, with respect to a menu function, the processor 22 may change the display 23 to show a menu of available applications based upon pressing of the pushbutton switch 24. In other words, the pushbutton switch 24 may be a home switch or button, or key. Of course, other device functions may be performed based upon the pushbutton switch 24. In some embodiments, the finger-operated user input device may be a different type of finger-operated user input device, for example, forming part of a touch screen display. Other or additional finger-operated user input devices may be carried by the portable housing 21.

A finger biometric sensor 30 is carried by the pushbutton switch 24 to sense a user's finger 40 placed adjacent the finger biometric sensor. The finger biometric sensor 30 is carried by the pushbutton switch 24 so that when a user contacts and/or presses downward on the pushbutton switch, data from the user's finger 40 is acquired, for example, for finger matching and/or spoof detection, as will described in further detail below. In other words, the finger biometric sensor 30 may be responsive to static contact or placement of the user's finger 40 or object. Of course, in other embodiments, for example, where the finger biometric sensor 30 is not carried by a pushbutton switch, the finger biometric sensor may be a slide sensor and may be responsive to sliding contact, or the finger biometric sensor may be a standalone static placement sensor.

Figure 3:
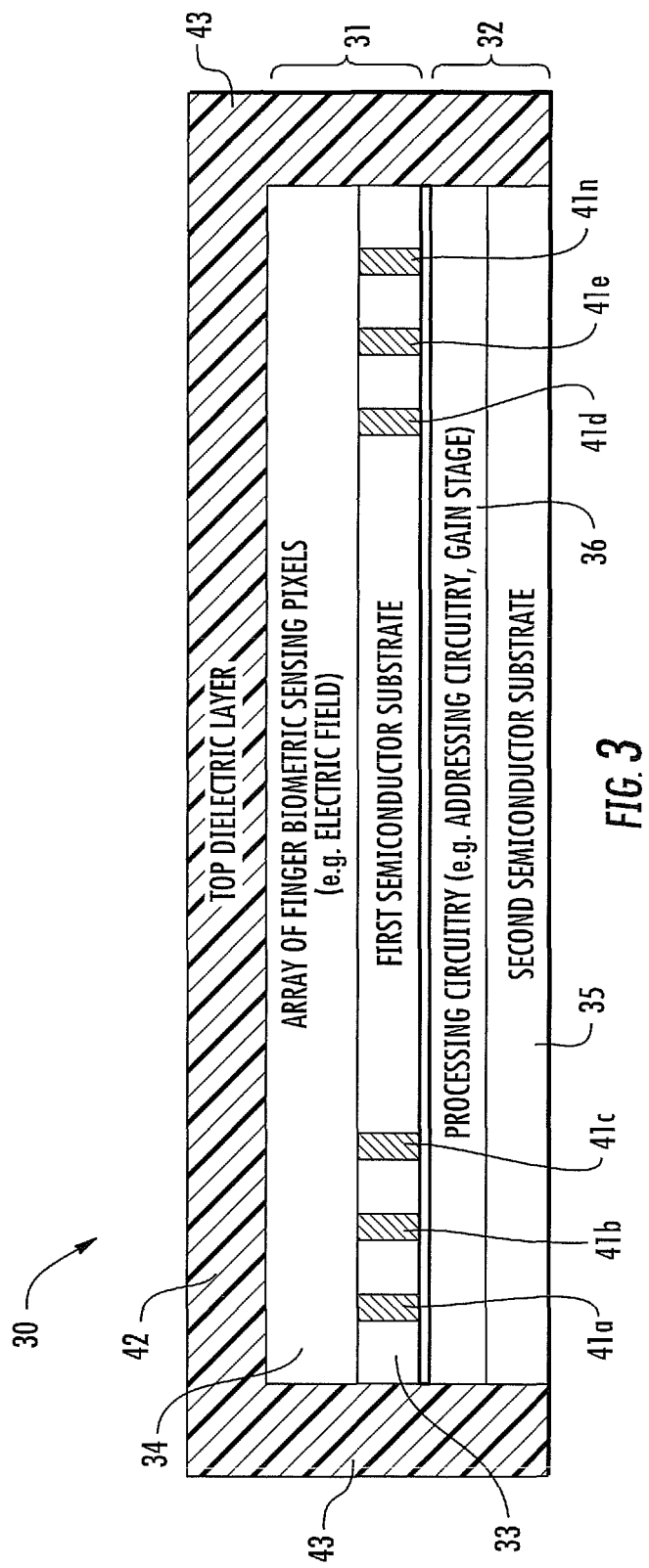
FIG. 3 is a more detailed schematic diagram of a portion of the finger biometric sensor of FIG. 2.

Referring now additionally to FIG. 3, the finger biometric sensor 30 includes first and second integrated circuit (IC) dies 31, 32 arranged in a stacked relation. The first IC die 31 includes a first semiconductor substrate 33 and an array of finger biometric sensing pixels 34 thereon. More particularly, the array of finger biometric sensing pixels 34 are carried by an upper surface of the first semiconductor substrate 33. The array of finger biometric sensing pixels 34 illustratively extends to a periphery of the upper surface of the first semiconductor substrate 33. The array of finger biometric sensing pixels 34 are electric field sensing pixels, such as, for example, as described in U.S. Pat. No. 5,940,526 to Setlak et al., assigned to the present assignee, and the entire contents of which are herein incorporated by reference.

The second IC die 32 includes a second semiconductor substrate 35. Processing circuitry 36 is carried on the second semiconductor substrate 35 and is coupled to the array of finger biometric sensing pixels 34. More particularly, the processing circuitry 36 may include pixel addressing circuitry 37 and one or more gain stages 38 coupled thereto. For example, the pixel addressing circuitry 37 may be for addressing rows and/or columns for addressing the pixels. The gain stage 38 may include one or more amplifiers, for example, one or more sense amplifiers with gain, as will be appreciated by those skilled in the art.

Figure 4:
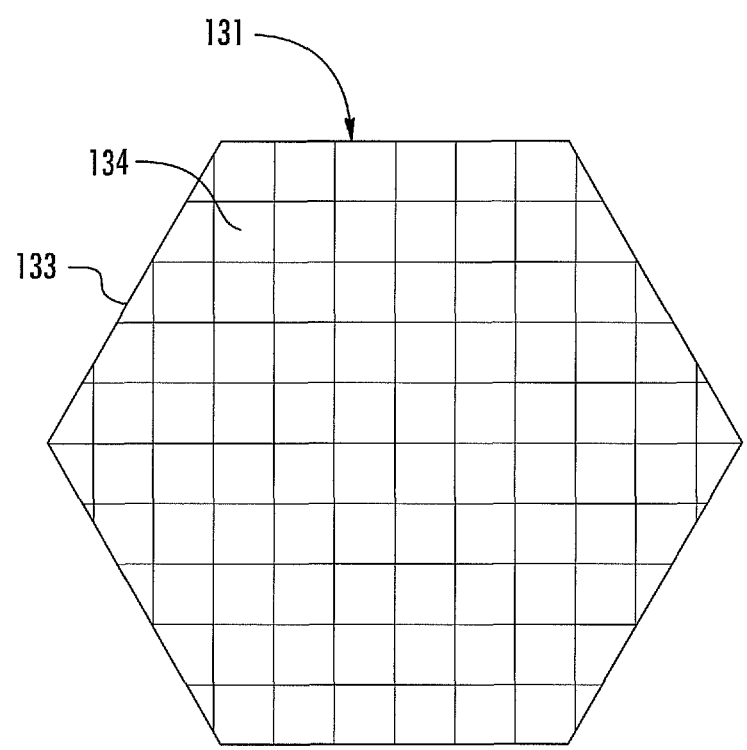
FIG. 4 is a schematic diagram of a portion of a hexagonal shaped finger biometric sensor according to another embodiment of the present invention.
Figure 5:
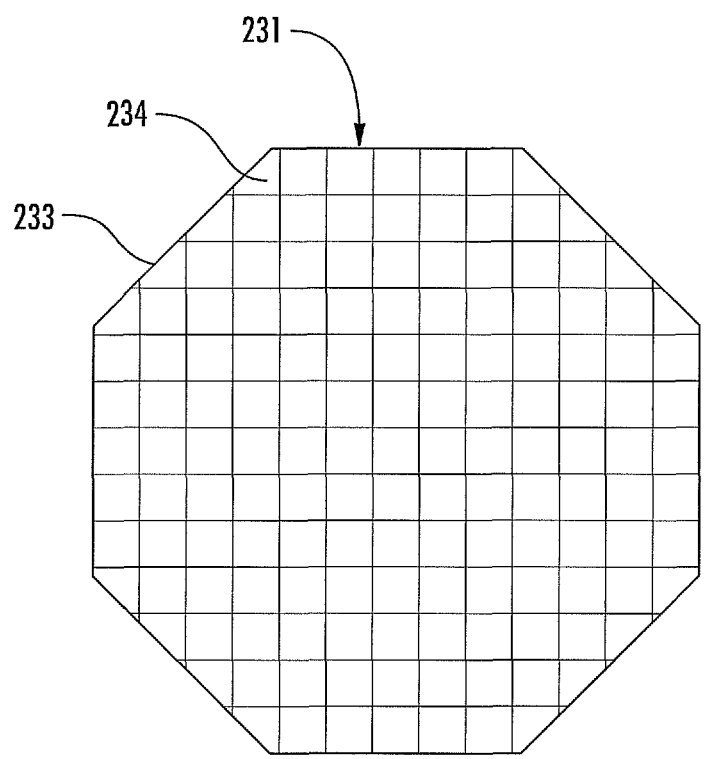
FIG. 5 is a schematic diagram of a portion of an octagonal shaped finger biometric sensor according to another embodiment of the present invention.

The first and second IC dies 31, 32 each have respective first and second non-rectangular shapes. In particular, the first and second IC dies 31, 32 each have respective first and second closed curve shapes, illustratively, a circular shape. Of course, in some embodiments, the first and second dies 31, 32 may each have other non-rectangular shapes, such as, for example, a polygon having a number of sides greater than four, e.g., hexagonal, octagonal, etc. In particular, as illustrated in FIG. 4, the array of finger biometric sensing pixels 134 is carried by the first semiconductor substrate 133 of a hexagonal shaped first die 131. FIG. 5 illustrates the array of finger biometric sensing pixels 234 being carried by the first semiconductor substrate 233 of an octagonal shaped first die 231.

Figure 6:
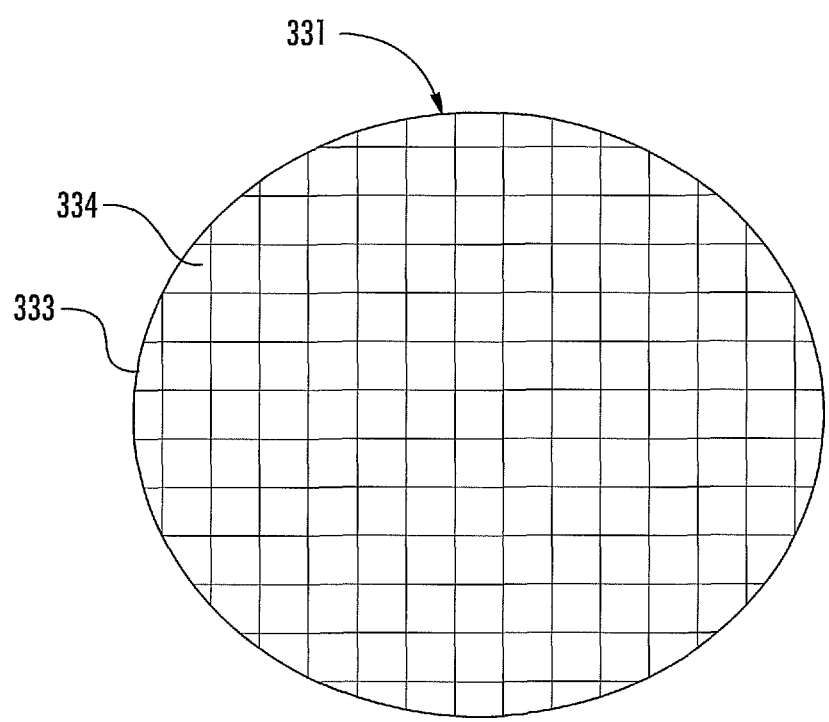
FIG. 6 is a schematic diagram of a portion of an oval shaped finger biometric sensor in according to another embodiment of the present invention.

In some embodiments, the non-rectangular shape may also be a closed curve, such as an oval. For example, as illustrated in FIG. 6, the array of finger biometric sensing pixels 334 is carried by the first semiconductor substrate 333 of an oval shaped first die 331.

The non-rectangular shapes of the first and second dies 31, 32 are coextensive. For example, the first and second IC dies 31, 32 may have the same shape and may also be aligned as shown. Of course, in other embodiments, the non-rectangular shapes of the first and second IC dies 31, 32 may not be coextensive and may not be aligned. For example, the second IC die 32 may be larger (i.e., surface area) than the first IC die 31.

The first IC die also includes electrically conductive vias 41a-41n extending therethrough. The electrically conductive vias 41a-41n couple the array of finger biometric sensing pixels 34 and the processing circuitry 36. In some embodiments, the electrically conductive vias 41a-41n may be through-silicon vias (TSVs), for example. Of course, in other embodiments, the electrical connections may be provided by other arrangements, as will be appreciated by those skilled in the art.

A top dielectric layer 42 illustratively overlays the array of finger biometric sensing pixels 34. A dielectric sidewall 43 extends downwardly from the top dielectric layer 42 and surrounds the first and second IC dies 31, 32. The top dielectric layer 42 and sidewall 43 may provide increased protection of the array of finger biometric sensing pixels 34, and/or may be used for aesthetics. In other words, the top dielectric layer 42 and sidewall 43 may be part of the pushbutton assembly. It should be understood that the dielectric top layer 42 is not the passivation layer of the first IC die 31. The finger biometric sensor 30 may include other and/or additional layers.

Figure 7:
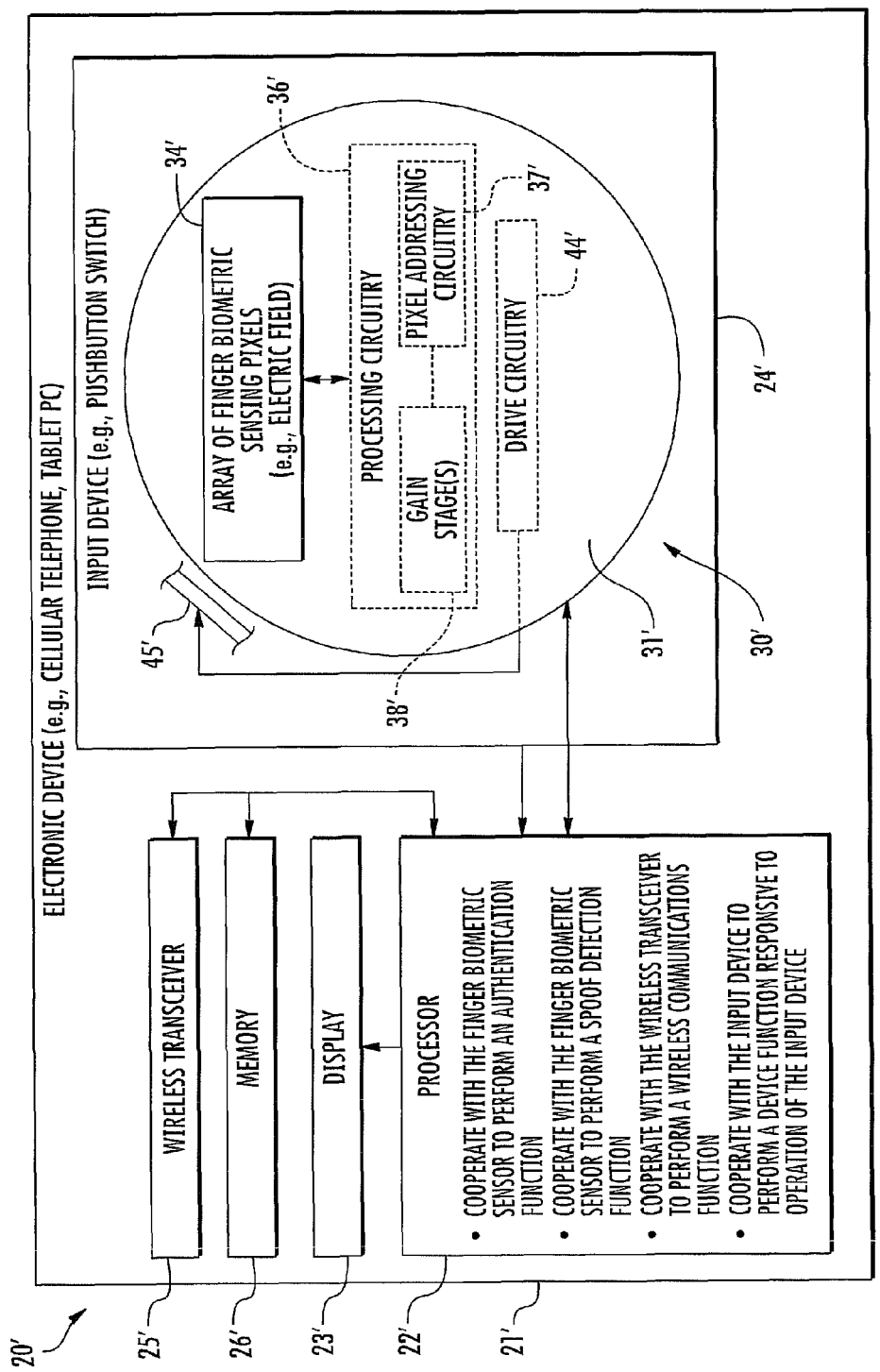
FIG. 7 is a schematic block diagram of an electronic device including a finger biometric sensor according to another embodiment of the present invention.

Referring now to FIG. 7, in some embodiments, the finger biometric sensor 30' may also include drive circuitry 44' coupled to the array of finger biometric sensing pixels 34' and a finger coupling electrode 45' adjacent the array of electric field sensing pixels and coupled to the drive circuitry. The array of finger biometric sensing pixels 34' may cooperate with drive circuitry 44' to couple the user's finger 40' to a reference and generate a detected signal based upon placement of the user's finger adjacent the array of finger biometric sensing pixels, as will be appreciated by those skilled in the art. Further details of example drive circuitry 44' and finger coupling electrode are described in U.S. Pat. No. 5,963,679, to Setlak and assigned to the present assignees, and the entire contents of which are herein incorporated by reference.

Alternatively, the finger biometric sensor 30 may not include a finger coupling electrode, but rather the finger biometric sensing pixels 34 may be operated in one of a transmitting mode for transmitting RF into the user's finger and a sensing mode for receiving finger biometric data. In other words, the processing circuitry 36, and more particularly, the pixel addressing circuitry 37 may operate some finger biometric finger sensing pixels in the transmitting mode while operating others in the receiving mode. Further details of operating the finger biometric sensing pixels in the transmitting and receiving modes are described in U.S. Application Publication No. 2011/0122059 to Guerrero et al., and assigned to the assignee of the present application, and the entire contents of which are herein incorporated by reference.

In some embodiments, the processor 22 may cooperate with the finger biometric sensor 30 to perform an authentication function. For example, the processor 22 may cooperate with the finger biometric sensor 30 to perform a matching operation between enrolled finger biometric data stored in the memory 26 and finger biometric data acquired from the finger biometric sensor 30. The processor 22 may also cooperate with the finger biometric sensor to perform a spoof detection function, for example. For example, the processor 22 may cooperate with the finger biometric sensor 30 to determine whether an object adjacent the array of finger biometric sensing pixels 34 is indicative of has characteristics of a spoof finger. Of course, the processor 22 may cooperate with the finger biometric sensor 30 to perform other and/or additional functions, as will be appreciated by those skilled in the art.

As will be appreciated by those skilled in the art, the finger biometric sensor 30 may be particularly advantageous for use in an electronic device where it may be desirable to have a non-rectangular shape and reduced size relative to prior art finger biometric sensors. For example, reducing the size of a finger biometric sensor reduces the amount of finger biometric sensing pixels, which in turn may reduce accuracy and increase processing time. This may be particularly true for a non-rectangular shaped finger biometric sensors. By moving processing circuitry typically located adjacent the finger biometric sensing pixels to another stacked die a reduced number of a finger biometric sensing pixels may be affected when reducing the size of the finger biometric sensor. Additionally, by extending the finger biometric pixels to a periphery, or where the processing circuitry was once located, impact on accuracy and processing speed may be further reduced.

Based upon increased area available on the second IC die 32, for example, the processing circuitry 36 may be capable or additional functions. For example, the processing circuitry 36 may perform or integrate key security, image processing and matching functions. Additionally, overall system security may improve because encryption keys and fingerprint template information may be increasingly difficult to get "hacked" from the outside world. By including the fingerprint matching functions "on chip" or on the second die 32, for example, may facilitate a power on authentication mode, which may place the processing circuitry 36 in a low power state. Overall processing time may also be reduced, which corresponds to reduced response times with respect to the user. Still further, the increased area on the second die 32 may be particularly suited for specialized processes, for example, high voltage processes, that may be targeted for the bottom die, which may assist the integration of module components, such as, for example, regulators, high voltage booster circuits, and decoupling components. This may further reduce component cost and reduce assembly complexity and related issues, as will be appreciated by those skilled in the art.

A method aspect is directed to a method of making a finger biometric sensor 30. The method includes forming a first integrated circuit (IC) die 31 that may include a first semiconductor substrate 33 and an array of finger biometric sensing pixels 34 thereon. The method also includes forming a second IC die 32 that includes a second semiconductor substrate 35 and processing circuitry 36 thereon to be coupled to the array of finger biometric sensing pixels 34. The method also includes arranging the first and second IC dies 31, 32 in a stacked relation. The first and second IC dies 31, 32 each have respective first and second non-rectangular shapes.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A finger biometric sensor comprising:
   first and second integrated circuit (IC) dies arranged in a stacked relation;
   said first IC die comprising a first semiconductor substrate and an array of finger biometric sensing pixels thereon;
   said second IC die comprising a second semiconductor substrate and processing circuitry thereon coupled to said array of finger biometric sensing pixels;
   said first and second IC dies each having respective first and second non-rectangular shapes, and said array of finger biometric sensing pixels extending to adjacent a periphery of said first semiconductor substrate so that said first IC die is devoid of said processing circuitry.

2. The finger biometric sensor according to claim 1 wherein the first and second non-rectangular shapes comprise respective first and second closed curve shapes.

3. The finger biometric sensor according to claim 1 wherein the first and second non-rectangular shapes comprise respective first and second circular shapes.

4. The finger biometric sensor according to claim 1 wherein the first and second non-rectangular shapes are coextensive.

5. The finger biometric sensor according to claim 1 wherein said first IC die comprises a plurality of electrically conductive vias extending therethrough and coupling said array of finger biometric sensing pixels and said processing circuitry.

6. The finger biometric sensor according to claim 1 wherein said processing circuitry comprises pixel addressing circuitry and at least one gain stage coupled thereto.

7. The finger biometric sensor according to claim 1 further comprising a top dielectric layer overlying said array of finger biometric sensing pixels, and a dielectric sidewall extending downwardly from said top dielectric layer and surrounding said first and second IC dies.

8. The finger biometric sensor according to claim 1 wherein said array of finger biometric sensing pixels comprises an array of electric field sensing pixels.

9. An electronic device comprising:
   a housing;
   a finger biometric sensor carried by said housing and comprising
   first and second integrated circuit (IC) dies arranged in a stacked relation;
   said first IC die comprising a first semiconductor substrate and an array of finger biometric sensing pixels thereon;
   said second IC die comprising a second semiconductor substrate and processing circuitry thereon coupled to said array of finger biometric sensing pixels;
   said first and second IC dies each having respective first and second non-rectangular shapes, and said array of finger biometric sensing pixels extending to adjacent a periphery of said first semiconductor substrate so that said first IC die is devoid of said processing circuitry.

10. The electronic device according to claim 9 wherein the first and second non-rectangular shapes comprise respective first and second closed curve shapes.

11. The electronic device according to claim 9 wherein the first and second non-rectangular shapes comprise respective first and second circular shapes.

12. The electronic device according to claim 9 wherein the first and second non-rectangular shapes are coextensive.

13. The electronic device according to claim 9 further comprising a wireless transceiver and a processor capable of cooperating therewith to perform at least one wireless communications function.

14. The electronic device according to claim 9 further comprising a finger-operated input device carrying said finger biometric sensor.

15. A method of making a finger biometric sensor comprising:
   forming a first integrated circuit (IC) die comprising a first semiconductor substrate and an array of finger biometric sensing pixels thereon;
   forming a second IC die comprising a second semiconductor substrate and processing circuitry thereon to be coupled to the array of finger biometric sensing pixels; and
   arranging the first and second IC dies in a stacked relation, the first and second IC dies each having respective first and second non-rectangular shapes;
   forming the first IC die comprising forming the array of finger biometric sensing pixels to extend adjacent a periphery of the first semiconductor substrate so that the first IC die is devoid of the processing circuitry.

16. The method according to claim 15 wherein the first and second non-rectangular shapes comprise respective first and second closed curve shapes.

17. The method according to claim 15 wherein the first and second non-rectangular shapes comprise respective first and second circular shapes.

18. The method according to claim 15 wherein the first and second non-rectangular shapes are coextensive.

19. The method according to claim 15 further comprising positioning a top dielectric layer to overlay the array of finger biometric sensing pixels, and a dielectric sidewall to extend downwardly from the top dielectric layer and surrounding the first and second IC dies.

* * * * *